United States Patent [19]

De Shong

[11] 4,399,988
[45] Aug. 23, 1983

[54] APPARATUS

[75] Inventor: George T. De Shong, Etters, Pa.

[73] Assignee: E. I. Du Pont de Nemours and Company, Wilmington, Del.

[21] Appl. No.: 324,131

[22] Filed: Nov. 23, 1981

[51] Int. Cl.³ .................... H05K 3/30; B25B 11/00
[52] U.S. Cl. .................... 269/8; 29/281.4;
29/739; 29/744; 29/760; 269/56; 269/58;
269/74; 269/289 MR; 269/294; 269/903
[58] Field of Search .............. 29/760, 744, 739, 741,
29/281.3, 281.4; 269/8, 903, 55, 56, 58, 59, 74,
289 MR, 294

[56] References Cited

U.S. PATENT DOCUMENTS

| 132,658 | 10/1872 | Gregg . | |
|---|---|---|---|
| 1,981,253 | 11/1934 | Schulz . | |
| 3,097,569 | 7/1963 | Scandale et al. . | |
| 3,410,176 | 11/1968 | Van Straaten | 269/8 |
| 3,543,679 | 12/1970 | Wahl . | |
| 3,572,680 | 3/1971 | Neff . | |
| 3,662,708 | 5/1972 | Shrader . | |
| 4,078,302 | 3/1978 | Fok et al. . | |
| 4,080,730 | 3/1978 | Woodman, Jr. | 29/760 X |
| 4,189,230 | 2/1980 | Zasio . | |
| 4,291,867 | 9/1981 | Williams et al. | 29/760 X |

Primary Examiner—Carl E. Hall

[57] ABSTRACT

A printed circuit board assembly fixture capable of securing the circuit board in a fixed relation to the inserting element of an electrical component inserting machine relies on the staking anvil of the assembly to precisely locate the circuit board and electromagnets to lock the circuit board in position for insertion of electrical components.

3 Claims, 6 Drawing Figures

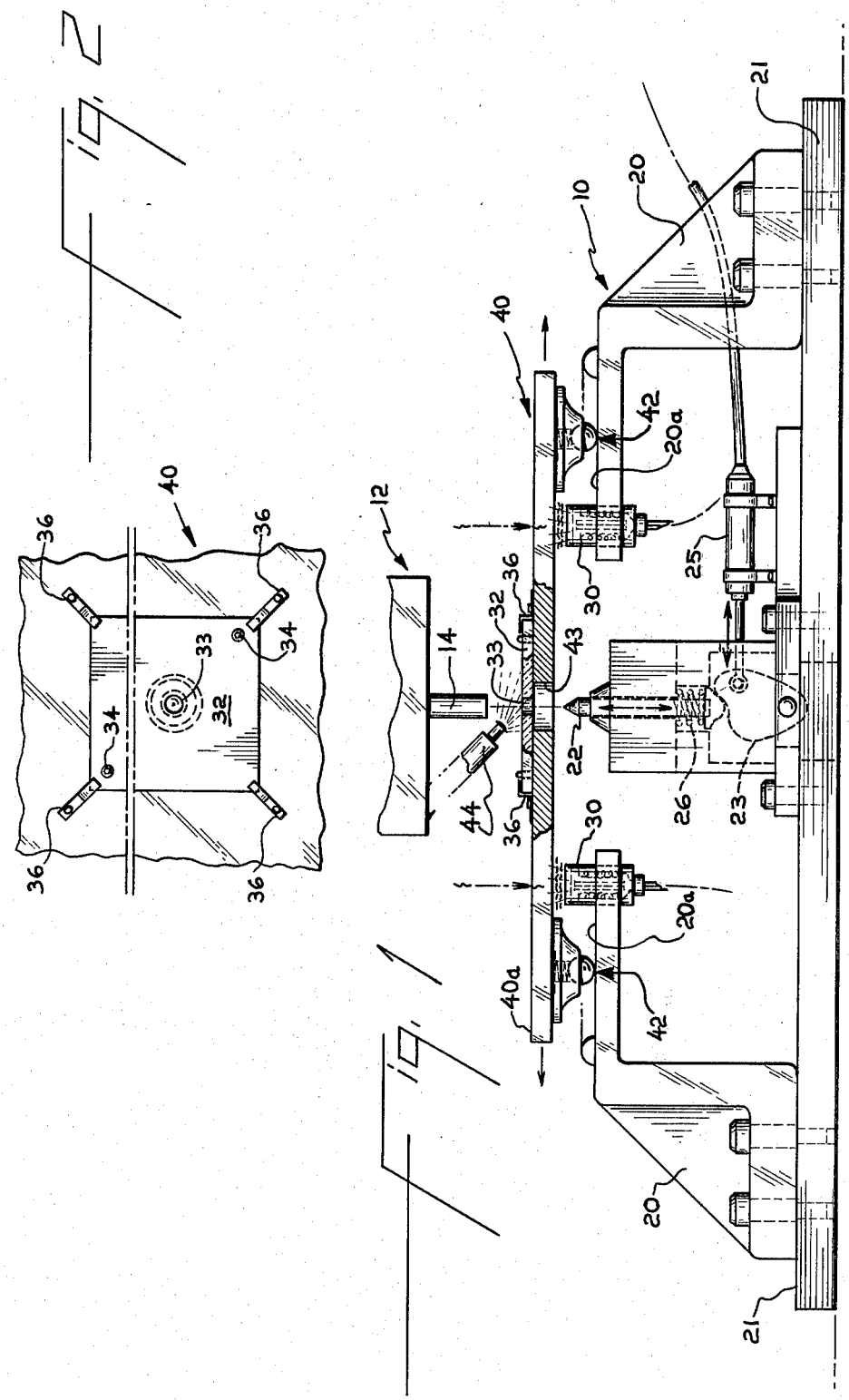

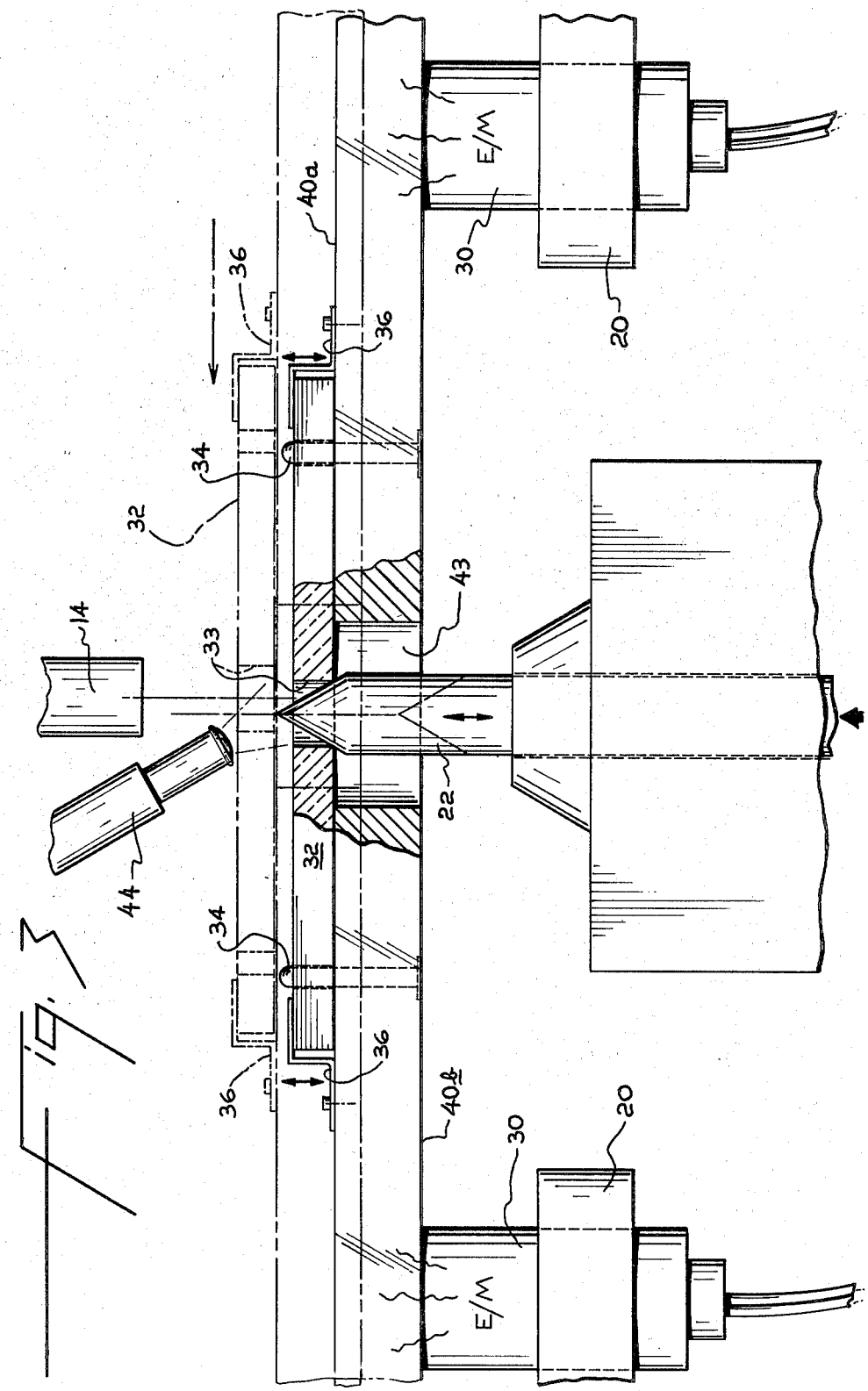

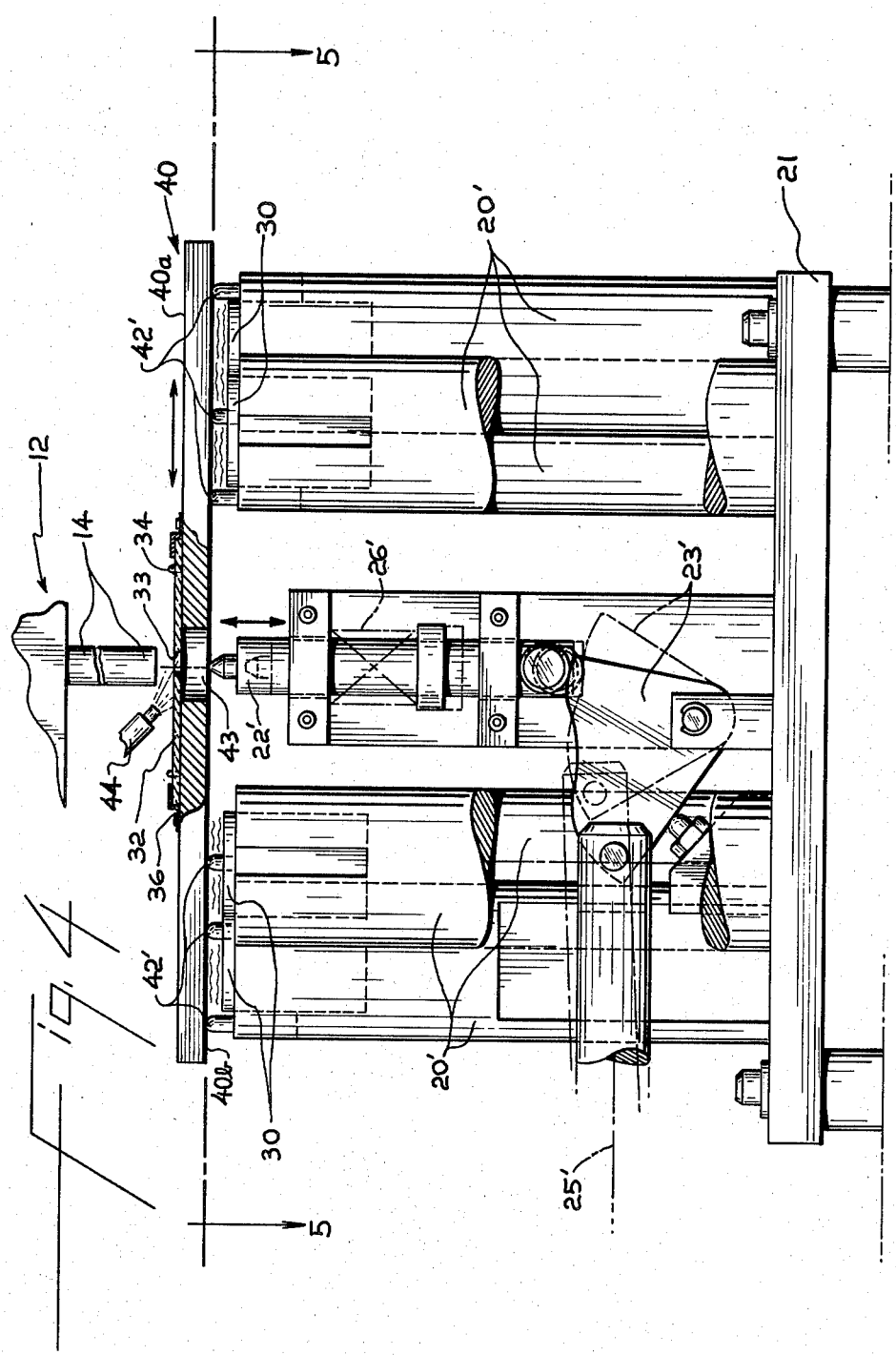

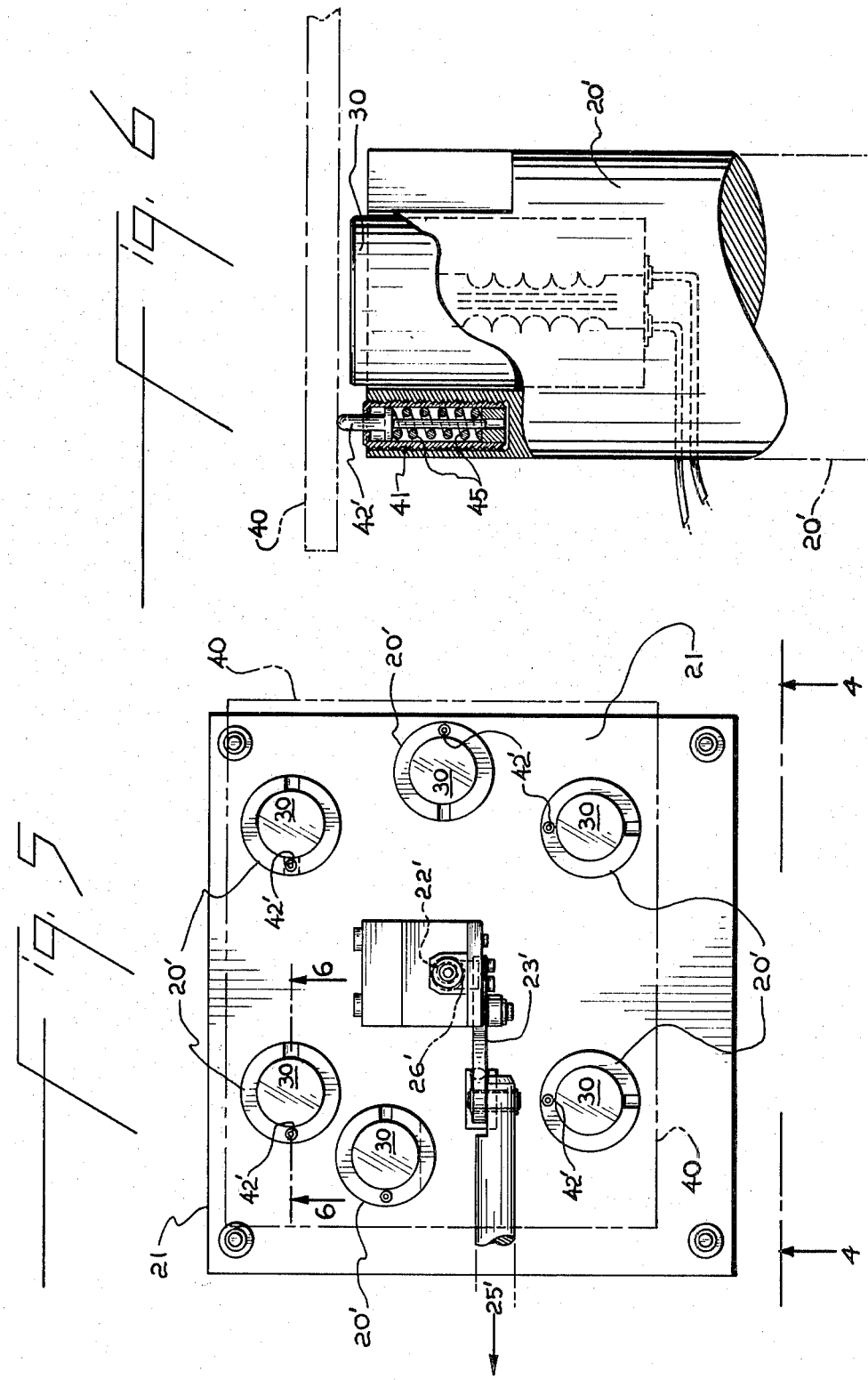

APPARATUS

BACKGROUND OF THE INVENTION

This invention relates to a printed circuit board locating machines and more particularly to apparatus movable under the work area of machines that insert electrical components into the printed circuit boards.

In the manufacture of printed circuit boards it is extremely important that the electrical component be inserted into the circuit board at a precise location and at a precise orientation so that it will connect properly within the circuit board.

It is customary in the assembly of circuit boards to use a component inserter wherein the component is delivered through a nozzle onto the printed circuit board. In such circumstances, a printed circuit board is positioned underneath the inserter for the reception into a hole in the circuit board of a component. The locater of this invention provides a more accurate less expensive way to obtain and maintain location as compared to similar devices disclosed in the prior art.

SUMMARY OF THE INVENTION

This invention provides an apparatus for locating a printed circuit board in relation to an inserting element of an electrical component inserting machine. The apparatus comprises a fixed anvil assembly located beneath the inserting machine. The anvil assembly includes a rigid support having an upper surface, and an anvil movable through an opening in the upper surface of the rigid support from an at rest position to a staking position in alignment with the inserting element. A plurality of energizable electromagnets attached to the upper surface of the rigid support are used to lock a ferromagnetic circuit board holder to the rigid support. Resilient means for supporting said plate are positioned between the upper surface of the rigid support and the lower surface of the plate so that the plate may be depressed to engage and be locked in position by the electromagnets after the circuit board is in alignment with the anvil and the inserting element of the electrical component inserting machine.

BRIEF DESCRIPTION OF THE DRAWINGS

FIG. 1 is a front elevation view of the apparatus of this invention in relation to a portion of the component inserting machine.

FIG. 2 is a partial top view of the circuit board holder with a circuit board positioned thereon.

FIG. 3 is an enlarged view of a portion of FIG. 1 showing the anvil aligned with the holes in the support plate and the circuit board.

FIG. 4 is an elevation view of the preferred embodiment of the apparatus of this invention.

FIG. 5 is a section view taken along line 5—5 of FIG. 4.

FIG. 6 is a view partially in section taken along line 6—6 of FIG. 5.

DETAILED DESCRIPTION OF THE PREFERRED EMBODIMENT

As seen from FIGS. 1-3 a fixed anvil assembly 10 is located beneath an electrical component inserting machine 12 which has a downwardly extending inserting machine 14. The anvil assembly includes supports 20 bolted to a base 21, and an anvil 22 also bolted to base 21. The anvil itself is movable from an at rest position (FIG. 1) to a staking position (FIG. 3) and back to the at rest position by means of the rotation of cam 23 engaging the lower portion of the anvil 22 and the action of return spring 26 attached to the lower end of anvil 22. The cam is in turn actuated by air cylinder 25 linked to the cam. A plurality of electromagnets 30 are fastened to and extend above the upper surface 20a of supports 20. Controls for the magnets may be local or remote. The operating current is direct current which is rectified from an alternating current source. Magnets were selected for this particular preferred apparatus which are rated for a pull of 24 pounds at 5 watts of power.

The printed circuit board 32 is located on and attached to circuit board holder 40 by means of locating pins 34 and clips 36. The circuit board 32 is provided with one or more holes 33 for receiving an electrical component such as a spring pin socket or the like. In such circumstances the printed circuit board is positioned underneath the inserter element 14 for reception of one component and then repositioned to receive a second component, etc.

In order to position the circuit board 32 the circuit board holder 40 is mounted on spring loaded castors 42 which ride on surface 20a of the support 20. The circuit board holder 40 is a ferromagnetic plate having upper and lower surfaces 40a and 40b respectively connected by hole 43. The spring loaded castors are mounted to the lower surface 40b and the printed circuit board is mounted to the upper surface 40a of the plate 40.

In operation, the printed circuit board 32 is precisely located on the upper surface 40a of plate 40 by means of locating pins 34, then held in position relative to the plate by means of clamps 36 so that holes 33 and 43 remain in alignment. Using the light from pin-point light source 44 the printed circuit board holder 40 is roughly positioned over anvil 22 which is in the raised or staking position. The board 32 is now in the position shown in phantom in FIG. 3. Next the plate or board holder 40 is manually depressed against spring loaded castors 42 allowing the tapered anvil 22 to enter the hole 33 in circuit board 32, and the lower surface 40b of the plate 40 to contact the electromagnets 32 which are then energized to lock the plate and circuit board in alignment with the anvil and the electrical component insertion element 14. When the circuit board is thus located and secured the anvil 22 is lowered and the person assembling the circuit board can actuate the component insertion machine 14 causing the electrical component, which may be a socket in this case, to be released from the insertion element 14 with force into hole 33 of the circuit board 32. The anvil 22 is then moved up to a staking position to secure the socket to the circuit board 32. The anvil is then returned to an at rest position and the assembly process can be repeated for the next element in the board.

In the alternate preferred embodiment shown in FIGS. 4, 5 and 6 the spring loaded casters 42 mounted to the lower surface of the circuit board holder 40 are functionally replaced by plungers 42' which are located in the columnar supports 20' that are attached to base 21. The plungers 42' are contained in a housing 41 which is recessed into the top surface of support 20' at a location adjacent the electromagnet 30 also housed in the support. Plunger 42' is backed by a spring 45 within the housing 41 with sufficient force to project the plunger upwardly above the upper surface of the magnet 30. The circuit board holder 40 then rides on plungers 42' while being positioned over the anvil 22'. This makes the circuit board holder lighter in weight and easier to handle. The operation of this embodiment is the same as described above with regard to the embodiment disclosed in FIGS. 1-3.

I claim:

1. Apparatus for locating a printed circuit board having a hole for receiving an electrical component in relation to an inserting element of an electrical component inserting machine comprising: a fixed anvil assembly located beneath the inserting machine, said anvil assembly including a rigid support having an upper surface, and an anvil movable past the upper surface of the support from an at rest position to a staking position in alignment with the inserting element; a circuit board holder that includes a ferromagnetic plate having upper and lower surfaces connected by a hole, means for attaching said circuit board in a fixed position on the upper surface of said plate with the component receiving hole in alignment with the hole in the plate; resilient means for supporting said plate positioned between the upper surface of the rigid support and the lower surface of the plate; and a plurality of energizable electromagnets attached to and extending above the upper surface of the support to hold said plate in a fixed position beneath said inserting element when energized, whereby the holes in said plate and said printed circuit board may be aligned with said anvil and then said plate may be depressed to engage said electromagnets.

2. The apparatus as defined in claim 1 wherein said resilient supports are spring-loaded castors attached to the lower surface of the plate.

3. The apparatus as defined in claim 1 wherein said resilient supports are spring-loaded plungers extending upwardly from said upper surface of said rigid support.

* * * * *